(12) United States Patent
Edelstein et al.

(10) Patent No.: US 9,859,209 B2
(45) Date of Patent: Jan. 2, 2018

(54) ADVANCED E-FUSE STRUCTURE WITH ENHANCED ELECTROMIGRATION FUSE ELEMENT

(71) Applicant: International Business Machines Corporation, Armonk, NY (US)

(72) Inventors: Daniel C Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/083,236

(22) Filed: Mar. 28, 2016

(65) Prior Publication Data

US 2017/0278792 A1    Sep. 28, 2017

(51) Int. Cl.
*H01L 23/525* (2006.01)
*H01L 21/3205* (2006.01)
*H01L 21/321* (2006.01)
*H01L 23/532* (2006.01)
*H01L 21/768* (2006.01)

(52) U.S. Cl.
CPC .... *H01L 23/5256* (2013.01); *H01L 21/32051* (2013.01); *H01L 21/32115* (2013.01); *H01L 21/76843* (2013.01); *H01L 21/76877* (2013.01); *H01L 23/53223* (2013.01); *H01L 23/53238* (2013.01)

(58) Field of Classification Search
CPC .............................. H01L 23/525; H01L 21/326
USPC ................................. 257/529; 438/601, 467
See application file for complete search history.

(56) References Cited

U.S. PATENT DOCUMENTS 4,227,168 A    10/1980    Knapp
4,228,417 A    10/1980    Belcher
(Continued)

OTHER PUBLICATIONS

List of IBM Patents or Patent Applications Treated As Related.
(Continued)

*Primary Examiner* — Asok K Sarkar
*Assistant Examiner* — Dmitriy Yemelyanov
(74) *Attorney, Agent, or Firm* — Jeffrey S. LaBaw; Steven J. Meyers

(57) ABSTRACT

A structure and method for fabricating an e-Fuse device in a semiconductor device is described. A method for fabricating an e-Fuse device includes providing a trench structure including an anode region, a cathode region and a fuse element which interconnects the anode and cathode regions in a dielectric material on a first surface of a substrate. The fuse element has a smaller cross section and a higher aspect ratio than the anode and cathode regions. The trench is filled in the anode and cathode regions with a high electromigration (EM) resistant conductive material. The trench in the fuse element region is filled with a low EM resistant conductive material. Another aspect of the invention is an e-Fuse device. The e-Fuse device includes an anode region, a cathode region and a fuse element which interconnects the anode and cathode regions in a dielectric material on a first surface of a substrate. The fuse element has a smaller cross section and a higher aspect ratio than the anode and cathode regions. The anode and cathode regions are comprised of a high EM-resistant conductive material. The fuse element is comprised of low EM-resistant conductive material.

11 Claims, 7 Drawing Sheets

(56) References Cited

U.S. PATENT DOCUMENTS

| | | | |
|---|---|---|---|
| 4,306,212 | A | 12/1981 | Belcher |
| 6,555,458 | B1 | 4/2003 | Yu |
| 6,754,135 | B2 | 6/2004 | Pilo |
| 6,897,543 | B1 | 5/2005 | Huang |
| 6,998,865 | B2 | 2/2006 | Bard |
| 7,157,782 | B1 | 1/2007 | Shih |
| 7,495,309 | B2 | 2/2009 | Sato |
| 7,732,922 | B2 | 6/2010 | Yang |
| 8,053,863 | B2 | 11/2011 | Takewaki |
| 8,115,274 | B2 | 2/2012 | Boeck |
| 8,299,570 | B2 | 10/2012 | Kim |
| 9,142,506 | B2 | 9/2015 | Bonilla |
| 9,171,801 | B2 | 10/2015 | Bao |
| 2008/0067629 | A1 | 3/2008 | Miyashita |
| 2009/0174075 | A1* | 7/2009 | Yang ................ H01L 23/5226 257/751 |
| 2009/0294901 | A1* | 12/2009 | Bonilla ............. H01L 23/5256 257/529 |
| 2010/0032797 | A1* | 2/2010 | Takewaki .......... H01L 23/5256 257/529 |
| 2013/0126817 | A1* | 5/2013 | Joshi ................. H01L 45/04 257/4 |

OTHER PUBLICATIONS

U.S. Appl. No. 15/083,216, filed Mar. 28, 2016.
U.S. Appl. No. 15/083,226, filed Mar. 28, 2016.
U.S. Appl. No. 15/407,209, filed Jan. 16, 2017.
U.S. Appl. No. 15/408,357, filed Jan. 17, 2017.
U.S. Appl. No. 15/424,088, filed Feb. 3, 2017.
IBM Patents or Patent Application Treated As Related.

* cited by examiner

TOP VIEW

A-A

B-B

TOP VIEW

A-A

B-B

TOP VIEW

A-A

B-B

TOP VIEW

A-A

B-B

TOP VIEW

A-A

B-B

US 9,859,209 B2

ADVANCED E-FUSE STRUCTURE WITH ENHANCED ELECTROMIGRATION FUSE ELEMENT

BACKGROUND OF THE INVENTION

This disclosure relates to integrated circuit devices, and more specifically, to a method and structure to create advanced e-Fuse structures in semiconductor devices.

As the dimensions of modern integrated circuitry in semiconductor chips continue to shrink, conventional lithography is increasingly challenged to make smaller and smaller structures.

Fuses are utilized within integrated circuit devices for a variety of purposes, such as programming certain functionality into the device or to enable or disable various devices within the circuit device. Such fuse structures can break electrical connections (such as in physically destroyable fuses or anti-fuses). Some fuse structures rely upon a smaller cross-sectional area between the anode and cathode and the fuse element. As the dimensions of the circuitry become ever smaller, it is desirable to reduce the voltage needed to program integrated circuits.

Thus, it is desirable to provide processes which can be used to make improved fuse structures for integrated circuitry.

BRIEF SUMMARY

According to this disclosure, an advanced e-Fuse structure and a method for constructing the structure are described. A method for fabricating an e-Fuse device includes providing a trench structure including an anode region, a cathode region and a fuse element which interconnects the anode and cathode regions in a dielectric material on a first surface of a substrate. The fuse element has a smaller cross section and a higher aspect ratio than the anode and cathode regions. The trench is filled in the anode and cathode regions with a high electromigration (EM) resistant conductive material. The trench in the fuse element region is filled with a low EM resistant conductive material.

Another aspect of the invention is an e-Fuse device. The e-Fuse device includes an anode region, a cathode region and a fuse element which interconnects the anode and cathode regions in a dielectric material on a first surface of a substrate. The fuse element has a smaller cross section and a higher aspect ratio than the anode and cathode regions. The anode and cathode regions are comprised of a high EM-resistant conductive material. The fuse element is comprised of low EM-resistant conductive material.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
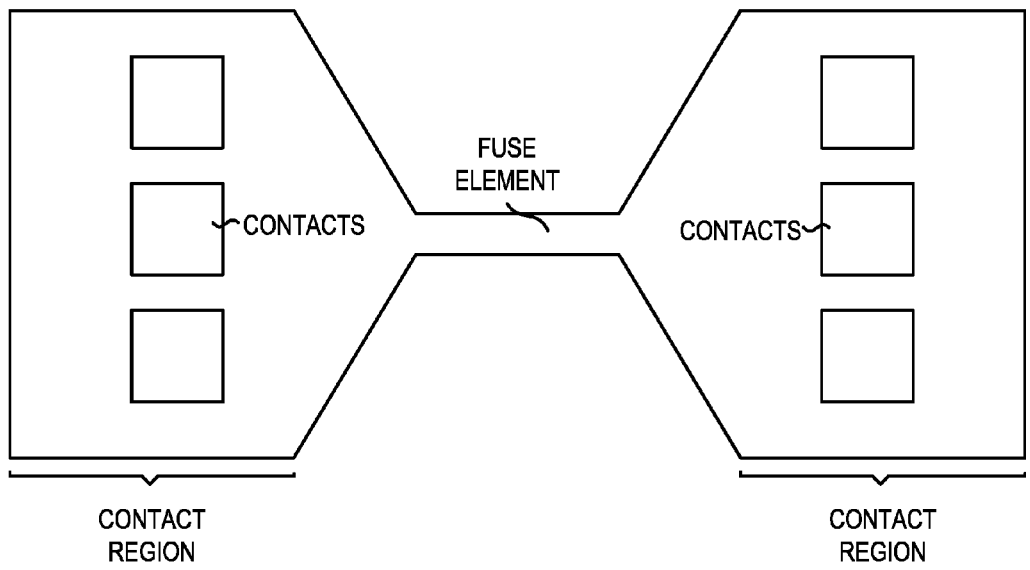
FIG. 1 is a top diagram of a prior art e-Fuse structure.

At a high level, the invention includes an e-Fuse structure and method for fabricating an e-Fuse structure with improved programmability by increasing the electromigration resistance (EM-resistance) difference between the cathode and anode ends as compared to the central part of the e-Fuse element through microstructure control.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures, etc.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

"Electromigration" is a term applied to the transport of mass in metals when the metals are subjected to high current density. "Electromigration resistance" or "EM-resistance" is a property of a metal which is resistant to this effect.

While the process steps to fabricate one embodiment of the invention are described with reference to a planar metal-oxide-semiconductor field-effect transistor (MOSFET) device, other embodiments described below are incorporated in other devices having source/drain regions and gate structures such as fin field effect transistors (FinFETs).

Electrical fuses (e-Fuses) are used to in semiconductor industry to implement array redundancy, field programmable arrays, analog component trimming circuits, and chip identification circuits. Programming of the prior art electrical fuses typically takes a substantial amount of current, which is undesirable in current technology node devices using low driving current. In addition, programming transistor takes up space in a semiconductor chip, as well as power consumption.

Embodiments will be explained below with reference to the accompanying drawings.

FIG. 1 is a top diagram of a prior art e-Fuse structure. The e-Fuse technology was invented by IBM to allow for dynamic real-time reprogramming of computer chips. Although computer logic is generally "hard-coded" onto a chip and cannot be changed after the chip has finished being manufactured, through the use of a set of e-Fuses, a chip manufacturer can allow for the circuits on a chip to change while it is in operation. The technology can provide in-chip performance tuning. If certain sub-systems fail, or are taking too long to respond, or are consuming too much power, the chip can instantly change its behavior by "blowing" an e-Fuse. The process creating shorts at selected e-Fuses is also called "programming". E-Fuses are used in the semiconductor industry to implement array redundancy, field programmable arrays, analog component trimming circuits, chip identification circuits and other devices.

In the prior art e-Fuse structures, an in-plane dimensional difference between the cathode and anode located at the ends of the e-Fuse and the central stripe or fuse element. The narrow dimension of the fuse element localizes the placement of the site where a circuit open is created. During programming, a positive voltage bias is applied to the anode contact region and a negative voltage at the cathode contact region through the contacts. Increased local current density is obtained at the narrow cross-section of the fuselink which also elevates the temperature. For example, as shown in FIG. 1, a two-dimensional "dog-bone" shaped e-Fuse is known, including a fuse element having a small cross-sectional area between the large cross-sectional area cathode and anode pads. The narrowing of cross-sectional area increases local current density in the fuse element. This type of fuse structure has been adopted in the semiconductor industry. Nonetheless, as the dimensions of other devices in the integrated circuits continue to shrink, there is a need for e-Fuse elements with better process control and higher programming efficiency.

The combination of high current density with the elevated temperature at the fuse element facilitates electromigration of the conductive material at the fuse element. Electrically "blowable" fuses take advantage of the electromigration (EM) effect to open an electrical connection. In a two-dimensional dog-bone shaped e-Fuse, such as that shown in FIG. 1, voids form at the small cross-section center fuse element due to high current density during programming, and eventually, create an electrically open circuit. It is also known that electromigration causes the conductive material to pile-up and form hillocks at the anode (most positive) end of the fuse element. Hillock formation is an undesirable effect.

The present invention improves upon the prior art with a novel electrical fuse structure with high programming efficiency through local heating. In addition to a dimensional difference, the invention further increases EM-resistance differences between cathode/anode and the fuse element of the e-Fuse through microstructure control. The invention uses different aspect ratios of areas of the trench in which the e-Fuse is formed to create a different grain structure in each of the two sets of areas. The grain structure created in the center part of the e-Fuse element has less EM-resistance than that created in the anode and cathode regions. The relative depth and aspect ratio of the fuse element portion is greater than the relative depth and aspect ratio of the cathode and anode regions.

Figure 2A:
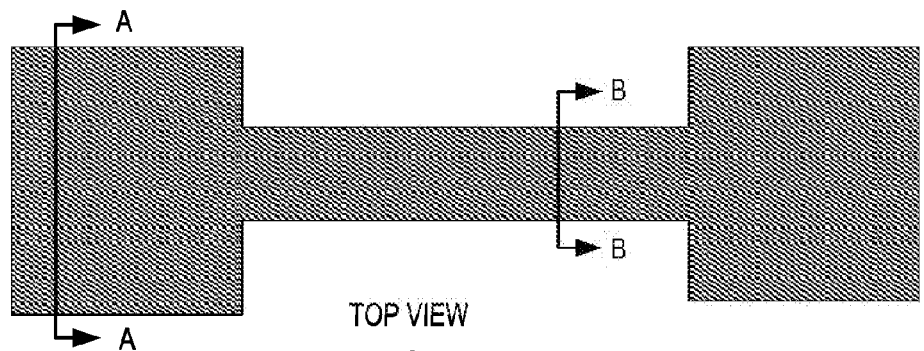
FIG. 2A is a top diagram of an e-Fuse structure to show the orientation of the cross-sectional diagrams.
Figure 2B:
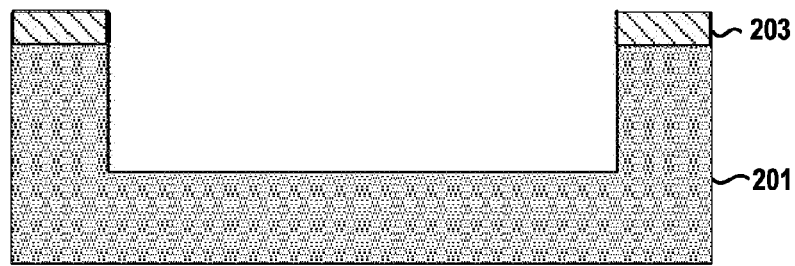
FIGS. 2B and 2C are cross-sectional diagrams depicting the structure after a patterning step has been performed according to a first embodiment of the invention.
Figure 2C:
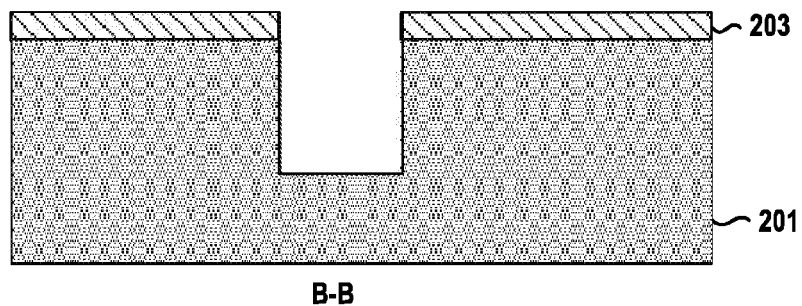

FIG. 2A is a top diagram of an e-Fuse structure to show the orientation of FIGS. 2B and 2C which are cross-sectional diagrams depicting the structure after a patterning step has been performed according to a first embodiment of the invention. Although the anode and cathode regions are shown as square shaped in the drawings, in alternative embodiments of the invention, these regions could be the irregular pentagon shape of the prior art as depicted in FIG. 1 or other shapes. FIG. 2B is a cross-sectional diagram through the cathode or anode region; FIG. 2C is a cross-sectional diagram through the fuse element. In FIGS. 2B and 2C, a trench is cut through dielectric layer 201 by means of an etch process using a hard mask 203 as a patterning element. The dielectric 201 may be any suitable dielectric material such as, for example, SiC, Si4NH3, SiO2, a carbon doped oxide, a nitrogen and hydrogen doped silicon carbide SiC(N,H) or multilayers thereof disposed over a substrate (not shown). The layer of dielectric material can be formed utilizing a conventional deposition process such as, for example, CVD, PECVD, and spin-on coating. The thickness of the blanket layer of dielectric material may vary depending on the technique used to form the same as well as the material make-up of the layer. Typically, the blanket layer of dielectric material has a thickness from 50 nm to 800 nm, with a thickness from 80 nm to 300 nm being more typical. The hard mask 203 is preferably a material which has a high etch selectivity/resistivity as compared to the dielectric layer 201 such as SiN if the dielectric layer 201 was silicon oxide. The hard mask 203 can be formed utilizing a conventional deposition process including, for example, chemical vapor deposition (CVD), plasma enhanced chemical vapor deposition (PECVD), chemical solution deposition, evaporation, and physical vapor deposition (PVD). Alternatively, the hard mask may be formed by one of thermal oxidation, and thermal nitridation. Typically, the blanket layer of hard mask material has a thickness from 10 nm to 80 nm with a thickness from 25 nm to 45 nm being more typical.

As shown in FIGS. 2B and 2C, different aspect ratios are created in the cathode/anode and fuse element regions by adjusting the height and width dimensions at both center and ends of the fuse structure. Typically, the depths of the trench at h1 and h2 are on the order of 35 nm to 480 nm, with a depth from 65 nm to 345 nm being more typical. The widths of the anode and cathode regions and the fuse element will vary according to the design requirements of the e-Fuse. However, in preferred embodiments of the invention, the widths of the contact regions would be between 50 nm to 500 nm and the width of the fuse element would between 20 nm to 80 nm, with a thickness from 65 nm to 345 nm being more typical.

Figure 3A:
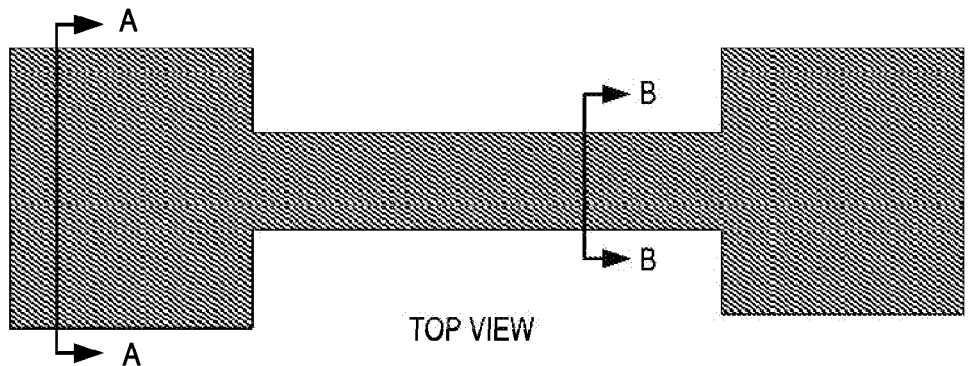
FIG. 3A is a top diagram of an e-Fuse structure to show the orientation of the cross-sectional diagrams.
Figure 3B:
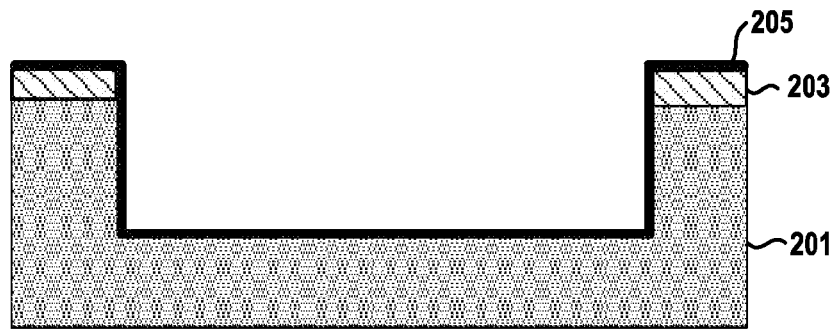
FIGS. 3B and 3C are cross-sectional diagrams depicting the structure after a liner deposition step has been performed according to a first embodiment of the invention.
Figure 3C:
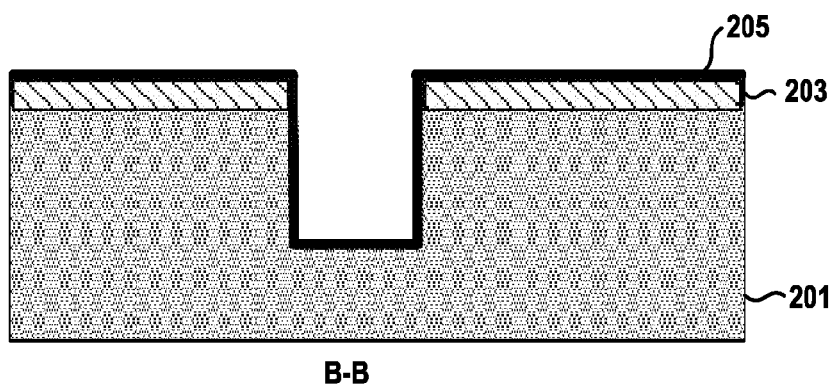

FIG. 3A is a top diagram of an e-Fuse structure to show the orientation of the cross-sectional diagrams. FIGS. 3B and 3C are cross-sectional diagrams respectively depicting the structure at the anode/cathode and the fuse element after a liner deposition step has been performed according to a first embodiment of the invention. Presuming that the correct aspect ratios can be created, the first embodiment is preferred from a simpler processing standpoint. The deposition of liner material(s) 205 can be formed on the trench and hard mask utilizing any conventional deposition process including, for example, chemical vapor deposition (CVD), plasma enhanced chemical vapor deposition (PECVD), physical vapor deposition (PVD), sputtering, plating, chemical solution deposition and electroless plating. The thickness of the liner can vary depending on the number of metal layers within the liner 205, the type of metal layer being formed and the technique used in forming the same. Typically, the liner 205 has a thickness from 1 nm to 20 nm, with a thickness from 2 nm to 10 nm being more typical. Suitable liner materials include Ta, Ti, W, Co, Ru, and their nitride materials, TaN, TiN, WN, CoN, RuN. The liner material prevents the diffusion of the subsequent copper layer into the dielectric.

Figure 4A:
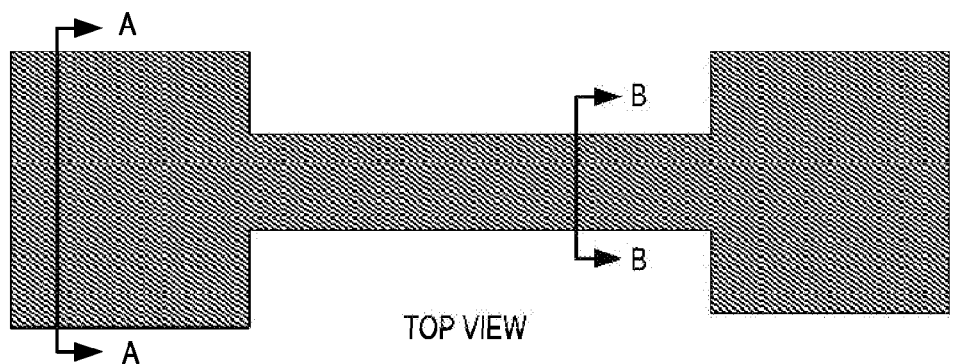
FIG. 4A is a top diagram of an e-Fuse structure to show the orientation of the cross-sectional diagrams.
Figure 4B:
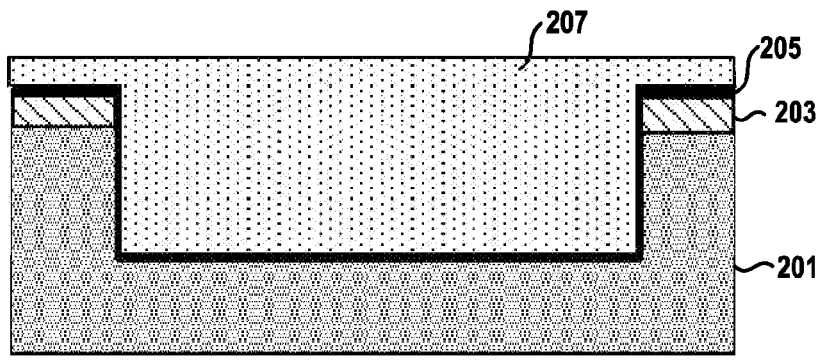
FIGS. 4B and 4C are cross-sectional diagrams depicting the structure after a deposition step in the cathode and anode areas has been performed according to a first embodiment of the invention.
Figure 4C:
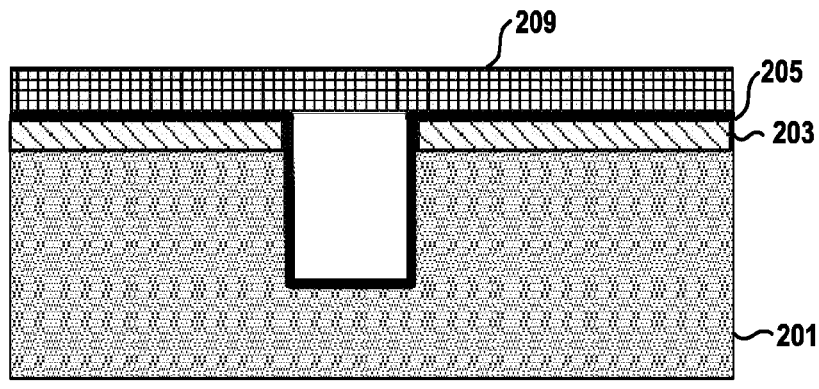

FIG. 4A is a top diagram of an e-Fuse structure to show the orientation of the cross-sectional diagrams. FIGS. 4B and 4C are cross-sectional diagrams respectively depicting the structures of the anode/cathode and fuse element regions after a deposition step has been performed according to a first embodiment of the invention. The deposition of the high EM-resistant layer 207 can be formed over the liner 205 in the anode and cathode regions utilizing any conventional deposition process including, for example, chemical vapor deposition (CVD), plasma enhanced chemical vapor deposition (PECVD), physical vapor deposition (PVD), sputtering, plating, chemical solution deposition and electroless plating. The thickness of the high EM-resistant layer can vary depending on the depth of the trench and the technique used in forming the copper layer. Suitable materials for the high EM-resistant layer include W, Co, Rh, Ru, Au, Ag, Ta, and Ti. A blockout mask 209 prevents deposition of the high EM-resistant layer in the fuse element region of the trench. For the purposes of the invention, a "High EM-resistant material" will have a higher EM-resistance than Cu or Al.

Figure 5A:
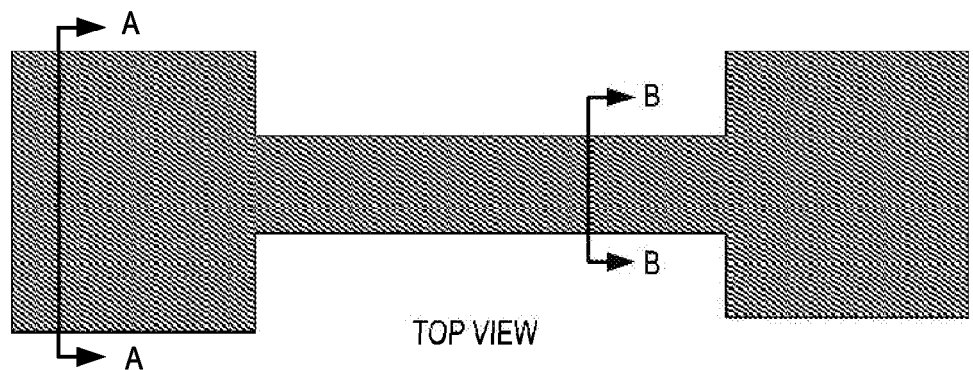
FIG. 5A is a top diagram of an e-Fuse structure to show the orientation of the cross-sectional diagrams.
Figure 5B:
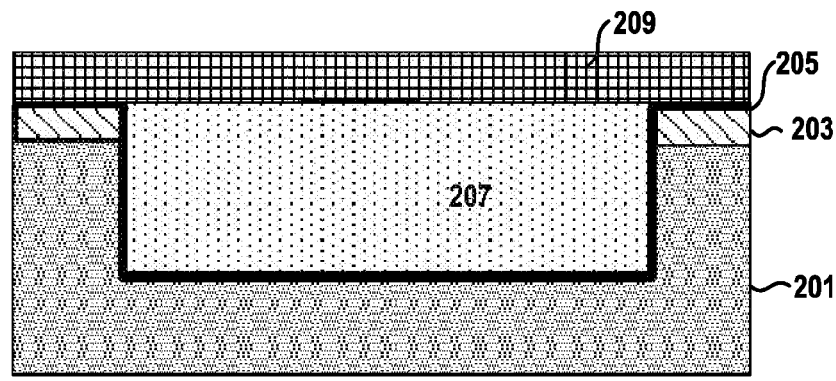
FIGS. 5B and 5C are cross-sectional diagrams depicting the structure after a deposition in the fuse element and an anneal step has been performed according to a first embodiment of the invention.
Figure 5C:
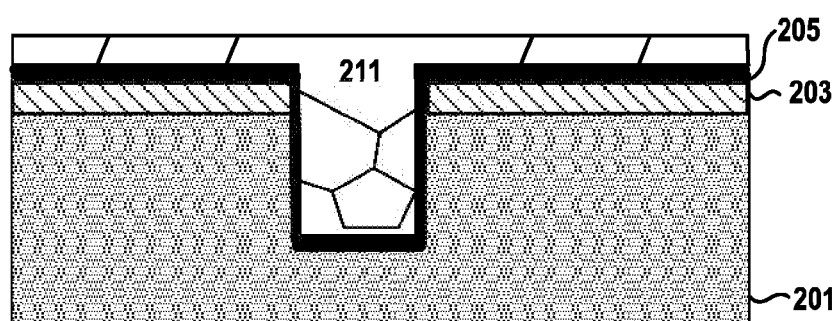

FIG. 5A is a top diagram of an e-Fuse structure to show the orientation of the cross-sectional diagrams. FIGS. 5B and 5C are cross-sectional diagrams respectively depicting the structure in the anode/cathode and fuse element regions after deposition of a copper layer in the fuse element regions and an anneal step have been performed according to a first embodiment of the invention. The metal layer 211 (copper or Al) can be deposited utilizing any conventional deposition process including, for example, chemical vapor deposition (CVD), plasma enhanced chemical vapor deposition (PECVD), physical vapor deposition (PVD), sputtering, plating, chemical solution deposition, electroless plating, or combination of the same. The thickness of the metal layer can vary depending on the depth of the trench and the technique used in forming the copper layer. Typically, the metal layer has an overburden thickness from 100 nm to 1000 nm, with a thickness from 300 nm to 800 nm being more typical.

The thermal anneal of the copper layer 211 can be carried out at a selected temperature between 100 to 400 degrees Centigrade. As an alternative to Cu, Al or another conductive, low EM-resistant material could be used as the fuse element.

Figure 6A:
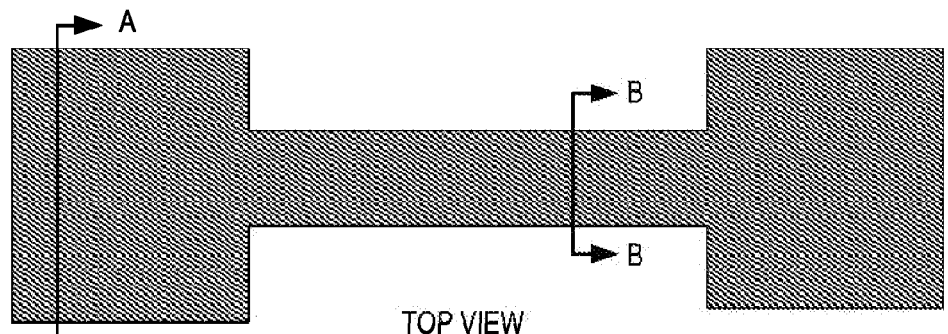
FIG. 6A is a top diagram of an e-Fuse structure to show the orientation of the cross-sectional diagrams.
Figure 6B:
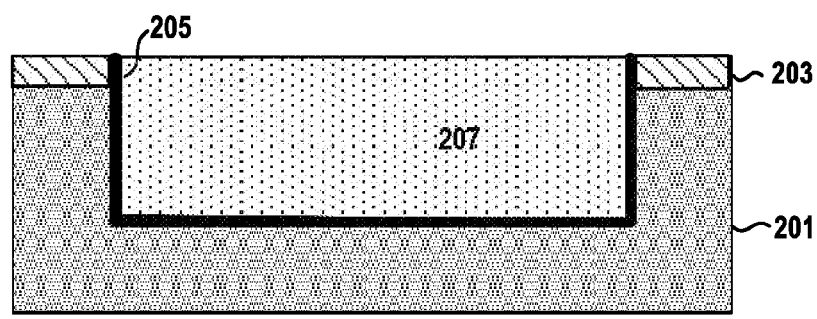
FIGS. 6B and 6C are cross-sectional diagrams depicting the structure after a planarization step has been performed according to a first embodiment of the invention.
Figure 6C:
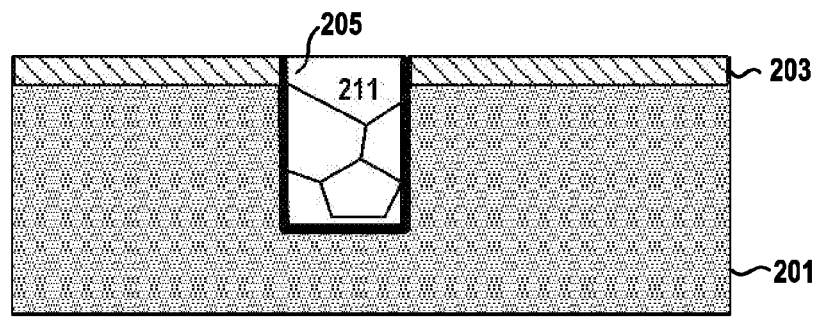

FIG. 6A is a top diagram of an e-Fuse structure to show the orientation of the cross-sectional diagrams. FIGS. 6B and 6C are cross-sectional diagrams depicting the structure after a planarization process such as a chemical mechanical polishing (CMP) step has been performed according to a first embodiment of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. As shown, the CMP step has removed the excess high EM-resistant and excess copper layer 211 and the liner layer 205 on the dielectric 201 and hard mask 203 outside the trenches. The hard mask 203 is used as an etch stop in a preferred embodiment of the invention. Other planarization processes are known to the art and are used in alternative embodiments of the invention.

Figure 7A:
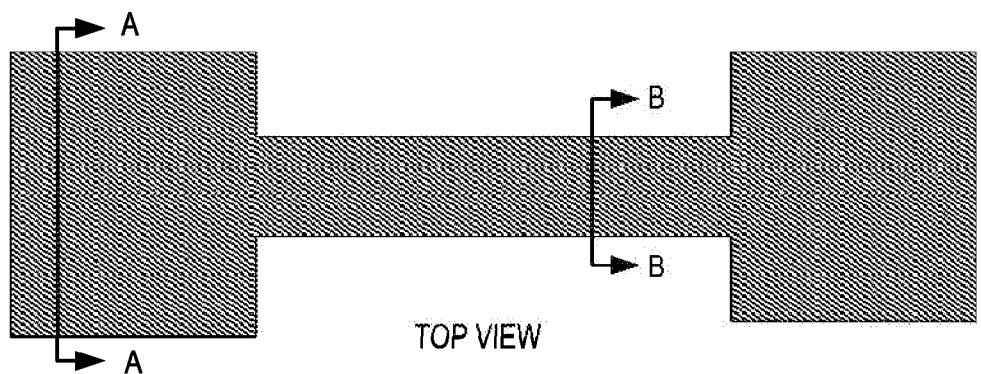
FIG. 7A is a top diagram of an e-Fuse structure to show the orientation of the cross-sectional diagrams.
Figure 7B:
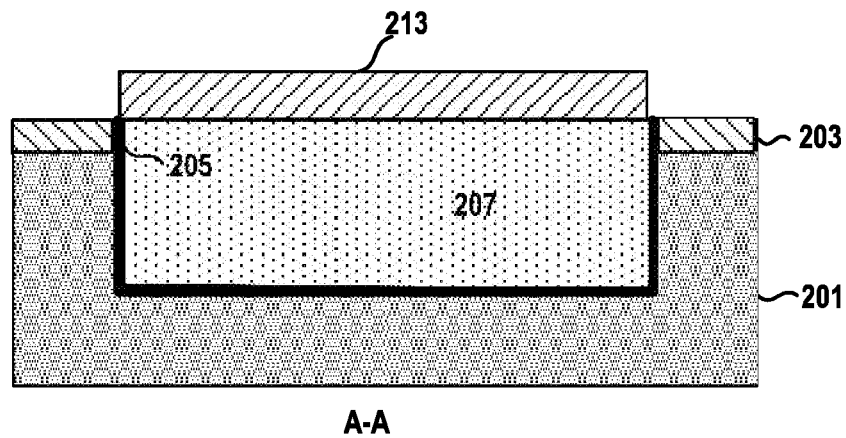
FIGS. 7B and 7C are cross-sectional diagrams depicting the structure after a patterning step has been performed according to a first embodiment of the invention.
Figure 7C:
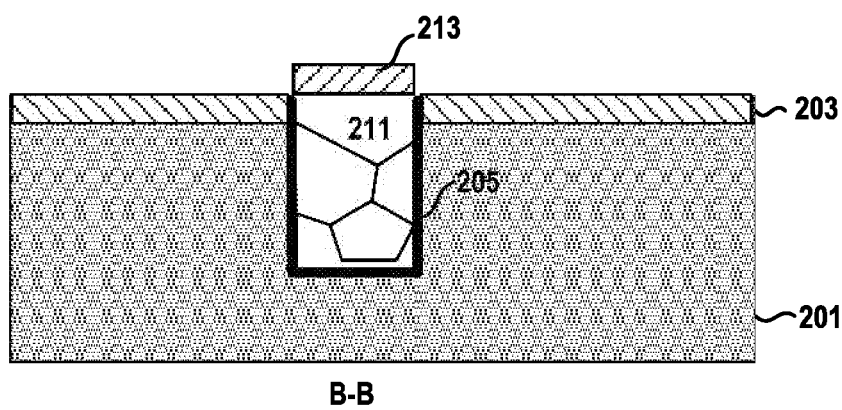

FIG. 7A is a top diagram of an e-Fuse structure to show the orientation of the cross-sectional diagrams. FIGS. 7B and 7C are cross-sectional diagrams respectively depicting the structure at the anode/cathode and fuse element regions after cap deposition and a patterning step has been performed according to a first embodiment of the invention. These steps are performed to place a selectively patterned metal cap 213 on the high EM-resistant layer 207 and copper layer 211 in the trench. Suitable materials for the metal cap 213 include Co, W, Rh, Ru and their alloy materials. As above, the deposition of the metal cap 213 can be formed by a conventional deposition process including, for example, CVD, PECVD, ALD, and PVD, sputtering, plating, chemical solution deposition and electroless plating In preferred embodiments, the metal cap 209 has a thickness from 0.5 nm to 10 nm, with a thickness from 1 nm to 4 nm being more typical. The metal cap 213 can be patterned with a photolithography step.

The purpose of the metal cap 213 is to control the electromigration properties in the copper bulk layer 211. In the crystalline structure within a single grain, because of the uniform lattice structure of the metal ions, there is hardly any electromigration. However, electrons can migrate through the grain boundaries and material interfaces, due to the current is transferred to create more electromigration failure. So in general, there will be more electromigration in the copper with more grain boundaries, i.e. the smaller grains in the fuse element, while the large grained copper in the anode and cathode regions is more EM-resistant. Further, the diffusion processes caused by electromigration can be divided into grain boundary diffusion, bulk diffusion and surface diffusion. Without the metal cap, the electromigration will be dominated by surface diffusion. With the metal cap, only grain boundary and bulk electromigration will take place, and the differences between the anode/cathode and fuse element regions will be magnified. The metal cap layer is optional, however, helps with hillock formation.

The resulting structure can be included within integrated circuit chips, which can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating an e-Fuse device comprising:
    providing a trench structure including an anode region, a cathode region and a fuse element region which interconnects the anode and cathode regions in a dielectric material on a first surface of a substrate, wherein the fuse element region has a smaller cross section and a higher aspect ratio than the anode and cathode regions;
    filling the trench in the anode and cathode regions with a high electromigration (EM) resistant conductive material in a first deposition step which deposits the high EM-resistant conductive material, wherein the high EM-resistant material has a higher EM-resistance than Cu or Al; and
    filling the trench in the fuse element region with a low EM resistant conductive material in a second deposition step which deposits the low EM-resistant conductive material.

2. The method as recited in claim 1 further comprising depositing a liner layer over the trench structure prior to filling the trench with the high EM resistant conductive material and the low EM resistant conductive material.

3. The method as recited in claim 2, further comprising:
    performing a planarization process to remove excess high EM-resistant conductive material, excess liner and excess low-EM resistant conductive over the dielectric layers outside the trench; and
    depositing a metal cap layer over the high EM-resistant conductive material and the low EM-resistant conductive material in the trench.

4. The method as recited in claim 1, wherein the low EM-resistant conductive material is copper and the method further comprises creating a fine grained copper structure in the fuse element using an anneal step, and wherein the fine grained copper structure is a polycrystalline structure.

5. The method as recited in claim 1, wherein the aspect ratio is a ratio of a height of the trench divided by a width of the trench and the difference in aspect ratios between the fuse element region and the anode and cathode regions is greater than 0.5.

6. The method as recited in claim 2, wherein the liner material is selected from the group consisting of Ta, Ti, W, Co, Ru, TaN, TiN, WN, CoN, and RuN.

7. The method as recited in claim 3, wherein the metal cap layer is selected from the group consisting of Co, W, Rh, and Ru and their alloy materials.

8. The method as recited in claim 1, wherein a cathode is formed in the cathode region, an anode is formed in the anode region and a fuse element is formed in the fuse element region.

9. The method as recited in claim 1, further comprising protecting the fuse element region with a block out mask during the first deposition step.

10. A method for fabricating an e-Fuse device comprising:
providing a trench structure including an anode region, a cathode region and a fuse element region which interconnects the anode and cathode regions in a dielectric material on a first surface of a substrate, wherein the fuse element region has a smaller cross section and a higher aspect ratio than the anode and cathode regions;
filling the trench in the anode and cathode regions with a high electromigration (EM) resistant conductive material, wherein the high EM-resistant material has a higher EM-resistance than Cu or Al; and
filling the trench in the fuse element region with a low EM resistant conductive material;
wherein high EM-resistant material is selected from the group consisting of Co, Rh, Ru, Au, Ag, Ta, and Ti.

11. A method for fabricating an e-Fuse device comprising:
providing a trench structure including an anode region, a cathode region and a fuse element region which interconnects the anode and cathode regions in a dielectric material on a first surface of a substrate, wherein the fuse element region has a smaller cross section and a higher aspect ratio than the anode and cathode regions;
filling the trench in the anode and cathode regions with a high electromigration (EM) resistant conductive material, wherein the high EM-resistant material has a higher EM-resistance than Cu or Al; and
filling the trench in the fuse element region with a low EM resistant conductive material;
depositing a metal cap layer over the high EM-resistant conductive material and the low EM-resistant conductive material in the trench, wherein the metal cap layer is selected from the group consisting of Co, W, Rh and Ru and their alloys;
applying an electric current to the e-Fuse device;
wherein the low EM-resistant conductive material is copper and the method further comprises annealing the copper to create a fine grained copper structure in the fuse element, and wherein the fine grained copper structure is a polycrystalline structure, wherein the metal cap layer controls the electromigration properties inside the fine grained copper structure preventing surface diffusion electromigration.

\* \* \* \* \*